(12) United States Patent
Knauer et al.

(10) Patent No.: US 7,425,837 B2
(45) Date of Patent: Sep. 16, 2008

(54) SPATIAL TRANSFORMER FOR RF AND LOW CURRENT INTERCONNECT

(75) Inventors: William Knauer, Chagrin Falls, OH (US); Eric Saint-Etienne, Seyssinet-Pariset (FR); Vincent Reynaud, Grenoble (FR)

(73) Assignees: Keithley Instruments, Inc., Cleveland, OH (US); Mesatronic S.A., Voiron (FR)

( * ) Notice: Subject to any disclaimer, the term of this patent is extended or adjusted under 35 U.S.C. 154(b) by 0 days.

(21) Appl. No.: 11/436,821

(22) Filed: May 18, 2006

(65) Prior Publication Data

US 2007/0268030 A1 Nov. 22, 2007

(51) Int. Cl.
*G01R 31/02* (2006.01)

(52) U.S. Cl. ..................................................... 324/754
(58) Field of Classification Search ......... 324/754–762, 324/158.1, 73.1; 333/246–248
See application file for complete search history.

(56) References Cited

U.S. PATENT DOCUMENTS

| | | | |
|---|---|---|---|
| 3,911,361 A | 10/1975 | Bove et al. | |
| 6,034,533 A * | 3/2000 | Tervo et al. | 324/762 |
| 6,160,412 A | 12/2000 | Martel et al. | |
| 6,531,932 B1 | 3/2003 | Govind et al. | |
| 2003/0117157 A1 | 6/2003 | Tervo et al. | |
| 2004/0085081 A1* | 5/2004 | Logelin et al. | 324/754 |
| 2006/0181293 A1* | 8/2006 | Sullivan et al. | 324/754 |

\* cited by examiner

*Primary Examiner*—Vinh P Nguyen
(74) *Attorney, Agent, or Firm*—Pearne & Gordon LLP

(57) ABSTRACT

A spatial transformer includes an insulating substrate; a plurality of test terminal assemblies on the substrate; and a plurality of contact surfaces on the transformer, each providing an interconnection point for electrical connection between a respective test terminal assembly and a device under test. Each test terminal assembly has a center conductor trace on an upper substrate surface; a lower substrate guard trace beneath the center conductor trace; and a pair of upper substrate guard traces adjacent to opposite sides of the center conductor trace, the guard traces being electrically interconnected. The guard traces in combination with the center conductor trace provide a desired characteristic impedance for an RF signal applied therebetween or a guarded DC connection for a DC signal applied to the center conductor trace and a DC guard applied to the guard traces.

6 Claims, 2 Drawing Sheets

SPATIAL TRANSFORMER FOR RF AND LOW CURRENT INTERCONNECT

BACKGROUND OF THE INVENTION

The present invention relates to semiconductor testing and, in particular, to the interconnection of test instruments to a device under test.

Often, the on-wafer testing of semiconductor devices utilizes the interfacing of test instruments to test points and structures located within the wafer saw lines. As semiconductor dies and saw widths decrease in size, it becomes more difficult to connect test instruments to the device under test (DUT).

This problem is compounded when both RF and ultra low current DC measurements are desired. In RF measurements, an important consideration is maintaining a desired characteristic impedance to minimize issues such as, for example, reflections of RF energy. In ultra low current measurements (for example, sub-nanoampere), it is important to minimize the effects of extraneous voltage potentials. This is done by "guarding" a point of interest by effectively surrounding that point with elements at the same voltage as the point of interest, thereby preventing that point from "seeing" any other potentials.

So-called "spatial transformers" are used as an interconnection between test instruments and, for example, probe needles or membranes that make actual contact with the DUT. The spatial transformer serves as an intermediate structure that concentrates the test instrument connections into a form more suited to the high density inputs of the needles or membranes.

When both RF and precision DC measurements need to be made, it has been necessary to use a specially designed spatial transformer for each desired combination of RF and DC test terminals. Each RF connection uses RF terminals having a desired characteristic impedance and each precision DC connection uses a guarded terminal. This greatly complicates and increases the cost of obtaining a suitable spatial transformer.

SUMMARY OF THE INVENTION

A spatial transformer includes an insulating substrate; a plurality of test terminal assemblies on the substrate; and a plurality of contact surfaces on the transformer, each providing an interconnection point for electrical connection between a respective test terminal assembly and a device under test. Each test terminal assembly has a center conductor trace on an upper substrate surface; a lower substrate guard trace beneath the center conductor trace; and a pair of upper substrate guard traces adjacent to opposite sides of the center conductor trace, the guard traces being electrically interconnected. The guard traces in combination with the center conductor trace provide a desired characteristic impedance for an RF signal applied therebetween or a guarded DC connection for a DC signal applied to the center conductor trace and a DC guard applied to the guard traces.

DESCRIPTION OF THE PREFERRED EMBODIMENTS

Figure 1:
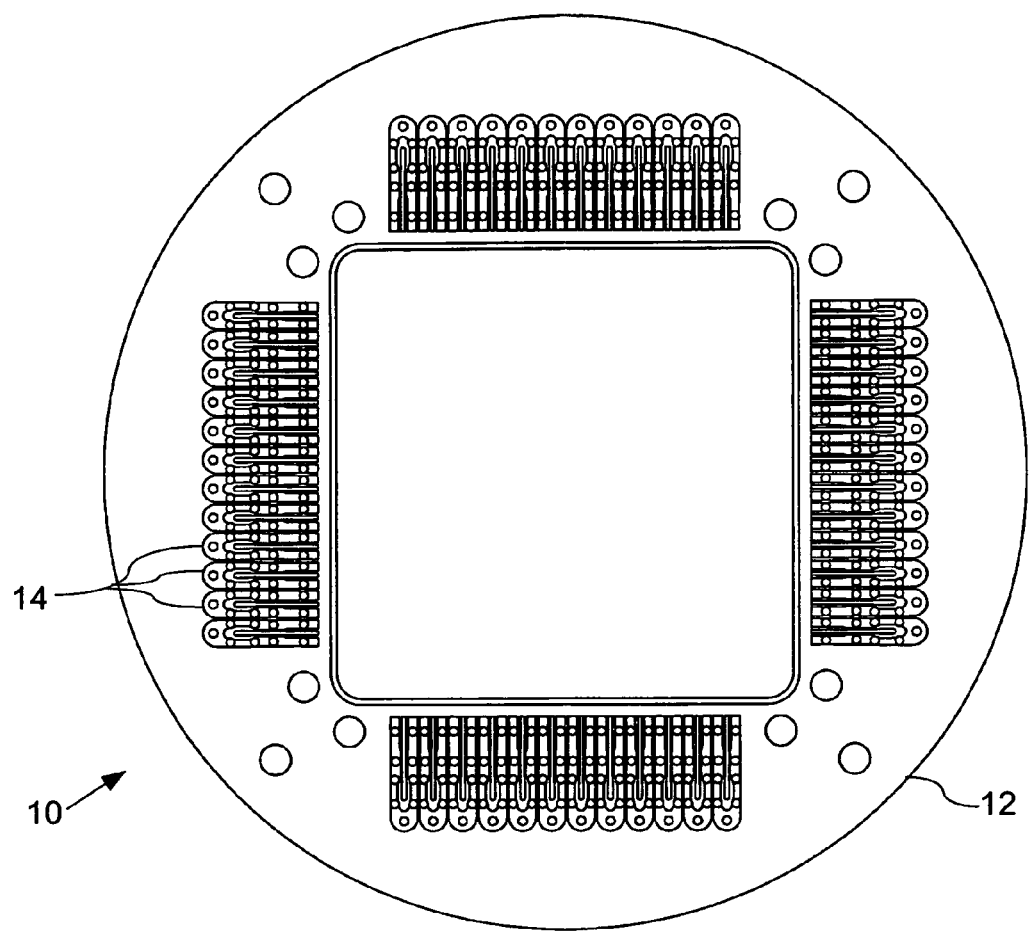
FIG. 1 is a top plan view of an example of the invention.

Referring to FIG. 1, a spacial transformer 10 includes an insulating substrate 12 with a series of test terminal assemblies 14. The substrate 12 may be, for example, a material suitable for printed circuit boards.

Figure 3:
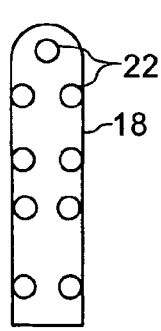
FIG. 3 is a plan view detail of a lower substrate trace of the example of FIG. 1.
Figure 4:
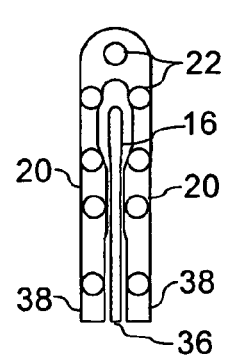
FIG. 4 is a plan view detail of the upper traces of the example of FIG. 1
Figure 2:
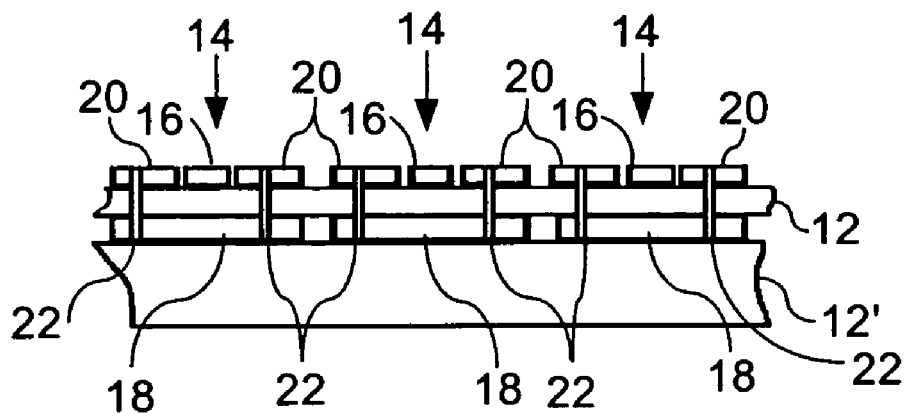
FIG. 2 is a cross sectional view of a portion of the example of FIG. 1.

Referring to FIGS. 2, 3 and 4, each test terminal assembly 14 includes a center conductor trace 16 on the upper surface of the substrate 12, a lower substrate guard trace 18 below the center conductor trace 16 and a pair of upper substrate guard traces 20 on opposite sides of the center conductor trace 16. The lower guard trace 18 may be, for example, located on a lower surface of the substrate as with the substrate 12 or internal to the substrate as in, for example, a multi-layer printed circuit board such as the combination of the substrate 12 and the substrate 12'. The substrate 12 provides electrical insulation between the trace 16 and the trace 18 and the traces 20 are spaced apart from the trace 16.

The lower substrate guard trace 18 and the upper substrate guard traces 20 are electrically connected. This may be accomplished by, for example, providing plated through the holes 22 in the substrate 12 between the traces.

Figure 6:
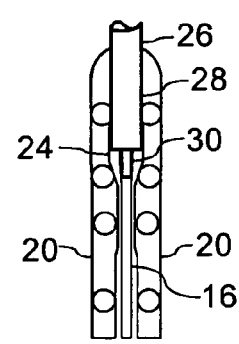
FIG. 6 is a plan view detail showing a coaxial cable attached to the example of FIG. 1.
Figure 5:
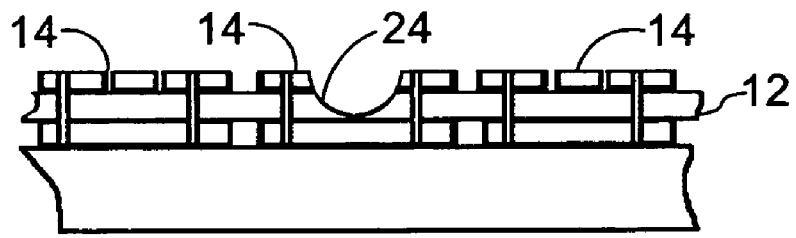
FIG. 5 is a cross sectional view illustrating a cable groove in the example of FIG. 1.

Each test terminal assembly 14 that is intended to be connected to a coaxial cable also includes a cable groove 24 in the upper surface of the substrate 12. Referring to FIGS. 5 and 6, the groove 24 provides relief for a coaxial cable 26 to be attached to the test terminal assembly 14. The shield 28 of the cable 26 may be attached to the upper substrate guard traces 20 and the center conductor 30 of the cable 26 may be attached to the center conductor trace 16 by, for example, soldering. Because of the relief provided by the cable groove 24, the center conductor 30 is maintained in alignment with the center conductor trace 16, the trace 16 being essentially a geometric extension of the conductor 30.

Figure 7:
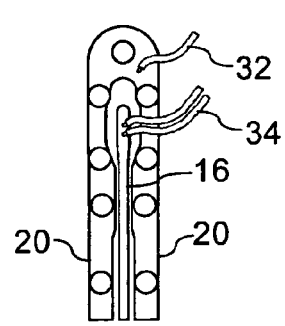
FIG. 7 is a plan view detail showing a guard conductor and a test conductor attached to the example of FIG. 1.

Alternatively, a guard conductor 32 and a test conductor 34 (FIG. 7) may be attached to the upper substrate guard traces 20 and the center conductor trace 16, respectively.

The lower substrate guard trace 18 and the upper substrate guard traces 20 are electrically connected. This may be accomplished by, for example, providing the plated through the holes 22 in the substrate 12 between the traces. This knitting improves low current guarding and performance.

It should be noted that the terms upper and lower are used for ease of understanding of the invention. While such an orientation is typical, and the relative relationship of the elements would remain the same, other orientations are possible.

The arrangement of the traces 16, 18, 20 is chosen to satisfy two criteria. For high precision DC measurements, the guard traces 18, 20 provide effective guarding of the center conductor trace 16. For RF measurements, the combination of the guard traces 18, 20 and the center conductor trace 16 exhibits a desired characteristic impedance, for example, 50 ohms.

For the DC measurements, the thickness of substrate between the upper and lower guards is several times less than the width of the upper guard traces. For RF measurements, the center conductor trace width, the trace thickness and the spacing are established to maintain the characteristic impedance through the assembly. The trace width may be changed at different points to maintain this impedance.

Figure 8:
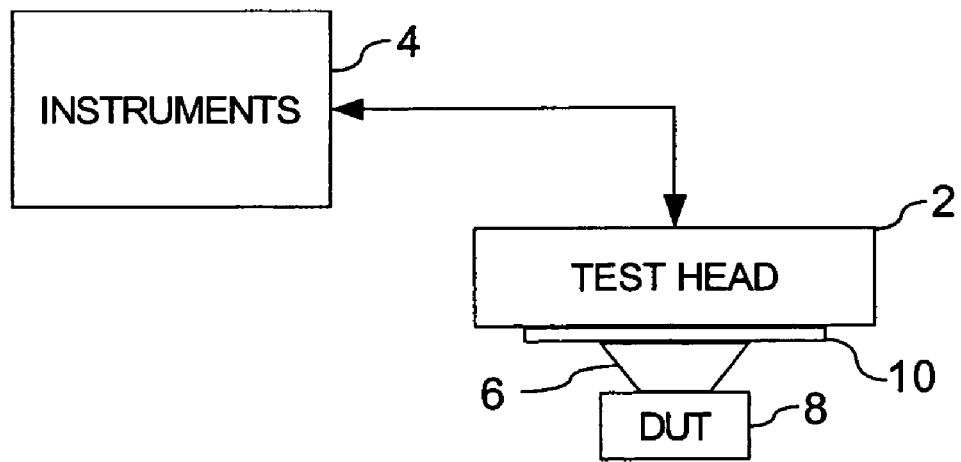
FIG. 8 is schematic representation of an example test setup employing the example of FIG. 1.

FIG. 8 shows the spatial transformer 10 in a test head 2 connected to test instruments 4. Referring to FIG. 4, each of the traces 16, 20 extends to respective contact surface 36, 38. These contact surfaces provide an interconnection point between the spatial transformer 10 and a DUT contacting structure 6 which provides the actual connection to a DUT 8. The DUT contacting structure 6 may be, for example, a contact membrane or probe needles. It is also possible to connect the test terminal assemblies 14 in other ways to the structure 6, for example, the contact surfaces could be on the bottom of the transformer 10 and connected to the assemblies 14 with plated through holes.

The spatial transformer 10 allows the same transformer to be used for any combination of RF or DC measurements. Each test terminal assembly 14 is suitable for either type of measurement. It has the desired characteristic impedance for RF measurements and the desired guarding for high precision DC measurements. Rather than having to construct a transformer for each different configuration, the same one can be used. This lowers cost, speeds up the process, and allows additional attention to optimizing a single design.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A spatial transformer, said transformer comprising:
   an insulating substrate;
   a plurality of test terminal assemblies on said substrate, each test terminal assembly having:
      a center conductor trace on an upper substrate surface;
      a lower substrate guard trace beneath said center conductor trace, said lower substrate guard trace at least including an imaginary projection of the entire center conductor trace thereon; and
      a pair of upper substrate guard traces adjacent to opposite sides of said center conductor trace, said guard traces being electrically interconnected, wherein said guard traces in combination with said center conductor trace provide a desired characteristic impedance for an RF signal applied therebetween or a guarded DC connection for a DC signal applied to said center conductor trace and a DC guard applied to said guard traces; and
   a plurality of contact surfaces on said transformer, each providing an interconnection point for electrical connection between a respective test terminal assembly and a device under test.

2. A spatial transformer according to claim 1, wherein each test terminal assembly intended for attachment of a coaxial cable, further comprises an individual longitudinal cable groove in said upper substrate surface to provide relief for attachment of a shield conductor of said coaxial cable to said upper substrate guard traces while maintaining a center conductor of said coaxial cable in alignment with said center conductor trace.

3. A spatial transformer according to claim 1, wherein respective guard traces are connected by plated through holes in said substrate.

4. A spatial transformer according to claim 1, wherein said contact surfaces are extended areas of said center traces and said upper substrate guard traces.

5. A spatial transformer according to claim 1, wherein said lower guard traces are located on a lower surface of said substrate.

6. A spatial transformer according to claim 1, wherein said lower guard traces are in an intermediate layer of said substrate.

\* \* \* \* \*